(12) United States Patent
Zhang et al.

(10) Patent No.: US 7,602,246 B2
(45) Date of Patent: Oct. 13, 2009

(54) GENERAL-PURPOSE WIDEBAND AMPLIFIER

(75) Inventors: Xuejun Zhang, San Diego, CA (US); Jianjun Zhou, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 124 days.

(21) Appl. No.: 10/932,545

(22) Filed: Sep. 1, 2004

(65) Prior Publication Data

US 2005/0270098 A1 Dec. 8, 2005

Related U.S. Application Data

(60) Provisional application No. 60/576,759, filed on Jun. 2, 2004.

(51) Int. Cl.
*H03F 3/45* (2006.01)
*H03F 3/16* (2006.01)

(52) U.S. Cl. .................................. 330/253; 330/310
(58) Field of Classification Search ................ None
See application file for complete search history.

(56) References Cited

U.S. PATENT DOCUMENTS

| | | | |
|---|---|---|---|
| 5,221,909 A | 6/1993 | Cole et al. | |
| 5,374,897 A | 12/1994 | Moraveji | 330/252 |
| 5,465,070 A * | 11/1995 | Koyama et al. | 327/350 |
| 5,489,876 A | 2/1996 | Pernici | 330/253 |
| 5,642,077 A * | 6/1997 | Nagaraj | 330/253 |
| 6,069,523 A | 5/2000 | Brown | 327/563 |
| 6,118,340 A | 9/2000 | Koen | 330/253 |
| 6,486,820 B1 | 11/2002 | Allworth et al. | 341/161 |
| 6,753,730 B2 * | 6/2004 | Yamamoto | 330/253 |
| 6,765,377 B1 * | 7/2004 | Lu | 324/123 R |
| 6,836,185 B1 * | 12/2004 | Pobanz | 330/260 |
| 2002/0097092 A1 | 7/2002 | Aude | 330/253 |
| 2003/0025562 A1 | 2/2003 | Andreou et al. | 330/308 |
| 2005/0099233 A1 * | 5/2005 | Zipper et al. | 330/261 |
| 2005/0184805 A1 * | 8/2005 | Murakami | 330/261 |

FOREIGN PATENT DOCUMENTS

| | | |
|---|---|---|
| EP | 0620638 | 1/1994 |
| EP | 1394933 | 8/2003 |
| GB | 2002980 | 7/1978 |
| GB | 2319418 | 5/1998 |

* cited by examiner

*Primary Examiner*—Robert Pascal
*Assistant Examiner*—Alan Wong
(74) *Attorney, Agent, or Firm*—George C. Pappas; William M. Hooks

(57) ABSTRACT

A single-stage amplifier includes (1) first and second "gain" transistors coupled in a common source configuration, (2) first and second resistors providing self-biasing for the first and second transistors, respectively, (3) first and second current sources providing bias currents for the first and second transistors, respectively, and (4) a load impedance coupled between the drains of the first and second transistors. The amplifier may further include (5) third and fourth "compensation" transistors coupled in parallel with, and used to compensate parasitic capacitances of, the first and second transistors, respectively, and (6) third and fourth resistors providing self-biasing for the third and fourth transistors, respectively. Variable gain may be achieved by varying the bias currents for the gain transistors. A two-stage amplifier may be formed with two stages coupled in cascade, with each stage including most or all of the circuit elements of the single-stage amplifier.

25 Claims, 6 Drawing Sheets

GENERAL-PURPOSE WIDEBAND AMPLIFIER

This application claims the benefit of provisional U.S. Application Ser. No. 60/576,759, entitled "General-Purpose Wideband Amplifier," filed Jun. 2, 2004

BACKGROUND

I. Field

The present invention relates generally to circuits, and more specifically to a general-purpose wideband amplifier.

II. Background

Amplifiers are commonly used to amplify signals to obtain the desired signal level. Amplifiers are also widely used for various applications such as communication, computing, networking, consumer electronics, and so on. As an example, for wireless communication, amplifiers may be used on a transmit path to amplify a signal prior to transmission via a wireless channel and on a receive path to amplify a signal received via the wireless channel.

An amplifier may be designed to provide a fixed gain or a variable gain. Variable gain amplifiers (VGAs) are commonly used in communication circuits (e.g., receivers and transmitters) to provide variable gains, and thus adjustable signal levels, depending on operating conditions, system requirements, and/or other factors. For example, VGAs are commonly used for power control in wireless communication systems. In a Code Division Multiple Access (CDMA) system, the signal from each wireless device (e.g., cellular phone or mobile handset) is spectrally spread over the entire system bandwidth. The signal transmitted by each wireless device acts as interference to the signals transmitted by other wireless devices in the system. The transmit power of each wireless device is thus adjusted such that the received signal quality for the wireless device, as measured at a receiving base station, is maintained at a target level. This power control achieves the desired performance for the wireless device, minimizes interference to other wireless devices, and increases system capacity.

A wireless device may be located anywhere relative to a receiving base station and may need different amounts of transmit power at different locations to achieve the target received signal quality at the base station. More transmit power is typically required when the wireless device is located far away from the base station, and less transmit power is typically required when the wireless device is close to the base station. For a CDMA system, the wireless device may be required to adjust its transmit power over a wide range (e.g., by 90 decibels (dB) or more) in order to combat the so-called "near-far" effect. Such a wide power control range is typically achieved by distributing variable gains across an entire transmit chain, possibly from analog baseband to radio frequency (RF) front end. The power control may thus be performed by VGAs located throughout the transmit chain.

Amplifiers with simple architecture and good performance are challenging to design, but are highly desirable for cost, power, and other considerations. VGAs with these same characteristics are even more difficult to design. There is therefore a need in the art for an amplifier with simple architecture and good performance.

SUMMARY

Various embodiments of a versatile general-purpose wideband amplifier are described herein. The amplifier is simple in design, has good performance, and is suitable for high frequency and/or wideband applications. The amplifier may also be operated as a fixed gain amplifier or as a wide dynamic range VGA.

An embodiment of a single-stage amplifier includes first and second "gain" transistors, first and second resistors, first and second current sources, and a load impedance. The first and second transistors are coupled in a common source configuration, receive and amplify a differential input signal, and provide a differential output signal. The first and second resistors couple between the drain (or collector) and the gate (or base) of the first and second transistors, respectively, and provide self-biasing for these transistors. The first and second current sources couple to the drains of the first and second transistors, respectively, and provide bias current for these transistors. The load impedance couples between the drains of the first and second transistors.

The amplifier may further include third and fourth "compensation" transistors and third and fourth resistors. The third and fourth transistors couple in parallel with the first and second transistors, respectively, and compensate for the gate-drain parasitic capacitance of the first and second transistors, respectively. The third and fourth resistors provide self-biasing for the third and fourth transistors, respectively.

The transistors may be field effect transistors (FETs), bipolar junction transistors (BJTs), and so on. The load impedance may be a resistor, an inductor, a capacitor, or a combination thereof. The first and second current sources may provide fixed or variable amounts of bias current for the first and second transistors, respectively. Variable gain for the amplifier may be achieved by varying the bias current.

An embodiment of a two-stage amplifier includes two stages coupled in cascade. Each stage includes first and second gain transistors, first and second resistors, first and second current sources, and first and second load impedances. The circuit elements of each stage are coupled in the same manner as for the single-stage amplifier, albeit with the first and second load impedances coupled in series and between the drains of the first and second transistors. The first and second transistors for each stage receive and amplify a differential input signal for that stage and provide a different output signal for that stage. A common node is formed between the first and second load impedances for each stage. The common nodes for both stages may be coupled together to provide (1) biasing for the second stage and (2) negative feedback for common-mode rejection. Compensation transistors may also be used for each stage.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
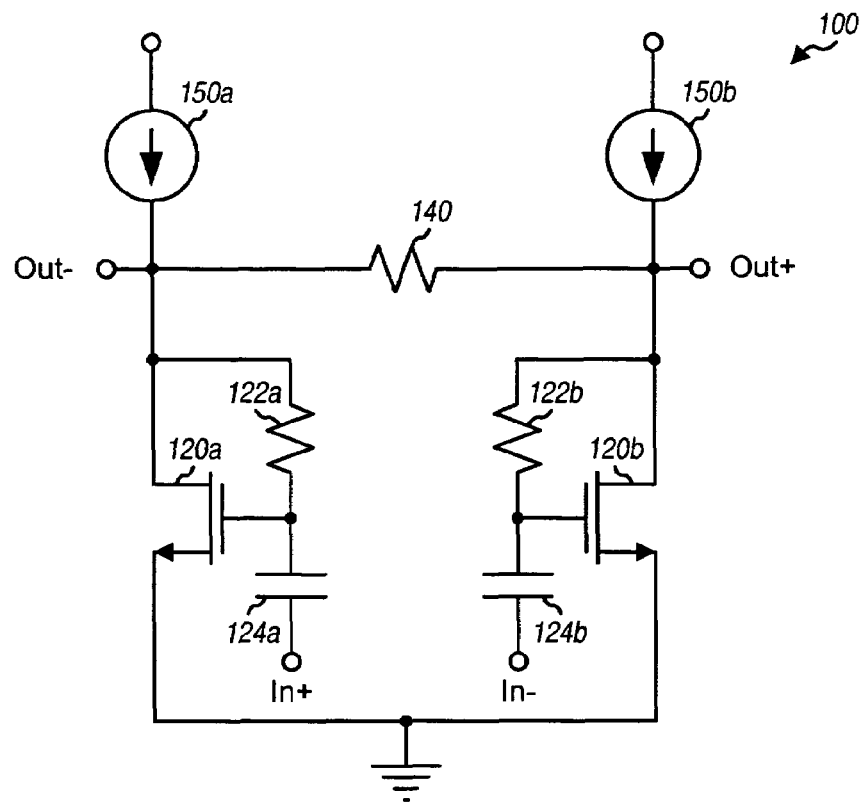
FIG. 1 shows a single-stage amplifier.

FIG. 1 shows a schematic diagram of a single-stage amplifier 100 in accordance with one embodiment. Amplifier 100 includes gain transistors 120a and 120b coupled in a common-source configuration. Transistor 120a has its source (or emitter) coupled to circuit ground, its gate (or base) receiving a non-inverting input signal (In+) via an AC coupling capacitor 124a, and its drain (or collector) providing an inverting output signal (Out−). Transistor 120b has its source coupled to circuit ground, its gate receiving an inverting input signal (In−) via an AC coupling capacitor 124b, and its drain providing a non-inverting output signal (Out+). Amplifier 100 thus receives a differential input signal (In+ and In−) and provides a differential output signal (Out+ and Out−).

A resistor 122a couples between the drain and gate of transistor 120a and provides self-biasing for transistor 120a. Similarly, a resistor 122b couples between the drain and gate of transistor 120b and provides self-biasing for transistor 120b. The drain of transistor 120a further couples to a current source 150a, and the drain of transistor 120b further couples to a current source 150b. A load impedance 140 couples to the drains of transistors 120a and 120b.

For the embodiment shown in FIG. 1, transistors 120a and 120b are N-channel FETs (N-FETs). In general, transistors 120a and 120b may be any type of transistor such as, for example, P-channel FETs (P-FETs), BJTs, gallium arsenide (GaAs) FETs, hetero-junction bipolar transistors (HBTs), high electron mobility transistors (HEMTs), and so on. For clarity, the following description assumes that the transistors are N-channel FETs.

Load impedance 140 may be a resistive load, as shown in FIG. 1, which may be suitable for a wideband amplifier. Load impedance 140 may also be a reactive load (e.g., an inductor), which may be suitable for a narrowband amplifier. Load impedance 140 may also be a complex load with both resistive and reactive elements.

Current sources 150a and 150b provide bias current for transistors 120a and 120b, respectively. Current sources 150a and 150b may provide a fixed/constant amount of bias current. Alternatively, current sources 150a and 150b may provide variable amounts of bias current based on a control signal. The gain of amplifier 100 may be adjusted by controlling the bias currents for transistors 120a and 120b, as described below.

Amplifier 100 may be used for wideband and/or high frequency applications because the nodes in amplifier 100 are low impedance. The impedance at the output nodes Out+ and Out− is determined by load impedance 140.

Each transistor 120 has a transconductance (which is denoted as $g_m$) that is dependent on the transistor type, the region of operation, and the bias current for the transistor (which is denoted as $I_D$). The bias current for each transistor 120, which is also called the drain or collector current, is provided by an associated current source 150.

The transconductance $g_m$ as a function of the drain current $I_D$ for a metal-oxide semiconductor FET (MOSFET) operating in a saturation region for a long channel model may be expressed as:

$$g_m = \sqrt{2\mu \cdot C_{ox} \frac{W}{L} I_D}, \quad \text{Eq (1)}$$

where
μ is the charge carrier mobility;
$C_{ox}$ is the gate oxide capacitance per unit area;
W is the channel width for the transistor; and
L is the channel length for the transistor.

These various parameters for the transistor are known in the art.

The transconductance $g_m$ as a function of the drain current $I_D$ for a MOSFET operating in a sub-threshold region may be expressed as:

$$g_m = \frac{I_D}{\zeta \cdot V_T}, \quad \text{Eq (2)}$$

where ζ is a non-ideality factor and $V_T$ is the thermal voltage.

The transconductance $g_m$ as a function of the drain current $I_D$ for a bipolar junction transistor in normal operation may be expressed as:

$$g_m = \frac{I_D}{V_T}. \quad \text{Eq (3)}$$

As shown in equations (1) through (3), different types of transistor and different operating regions are associated with different functions for transconductance $g_m$ versus drain current $I_D$. Other transistor types and operating regions may have other functions for transconductance versus drain current.

Regardless of how the transconductance $g_m$ may be expressed, the gain Av of each transistor 120 in single-stage amplifier 100 may be expressed as:

$$Av = \frac{1}{2} g_m \cdot Z, \quad \text{Eq (4)}$$

where Z is the load impedance 140. For simplicity, equation (4) does not include external or parasitic load. A more accurate equation for the gain Av may be obtained by replacing the load impedance Z in equation (4) with load impedance 140, parasitic capacitance and output resistance of N-FETs 120a and 120b and P-FETs of current sources 150a and 150b, and external load (for example, the input capacitance of N-FETs of next stage). The impedance of load 140 is typically much smaller (and more dominant) than that of the parasitic and external loads. Equation (4) indicates that the gain Av of each transistor 120 is directly related to its transconductance $g_m$. The gain of amplifier 100 is twice the gain Av of each transistor 120 for a differential design. As shown by the above equations, a variable gain may be achieved for amplifier 100 by adjusting the drain current $I_D$ of transistors 120a and 120b, which in turn varies the transconductance $g_m$ of each transistor, which then changes the gain Av of the transistor. Amplifier 100 may be used as a VGA, as described below.

Resistors 122a and 122b provide self-biasing for transistors 120a and 120b, respectively. The self-biasing of each transistor 120 via resistor 122 provides various benefits. First, the biasing circuitry is greatly simplified. Second, accurate control of the transconductance $g_m$ of each transistor 120 is possible since the transistor is diode connected by resistor 122 and the voltages at all four nodes of the transistor (the gate, source, drain, and bulk) are well defined. Third, the drain current $I_D$ may be easily changed to vary the biasing of transistor 120. AC coupling capacitors 124a and 124b are used to couple the different input signal (In+ and In−) to the gates of transistors 120a and 120b, respectively, in order to avoid affecting the self-biasing of these transistors.

Figure 2:
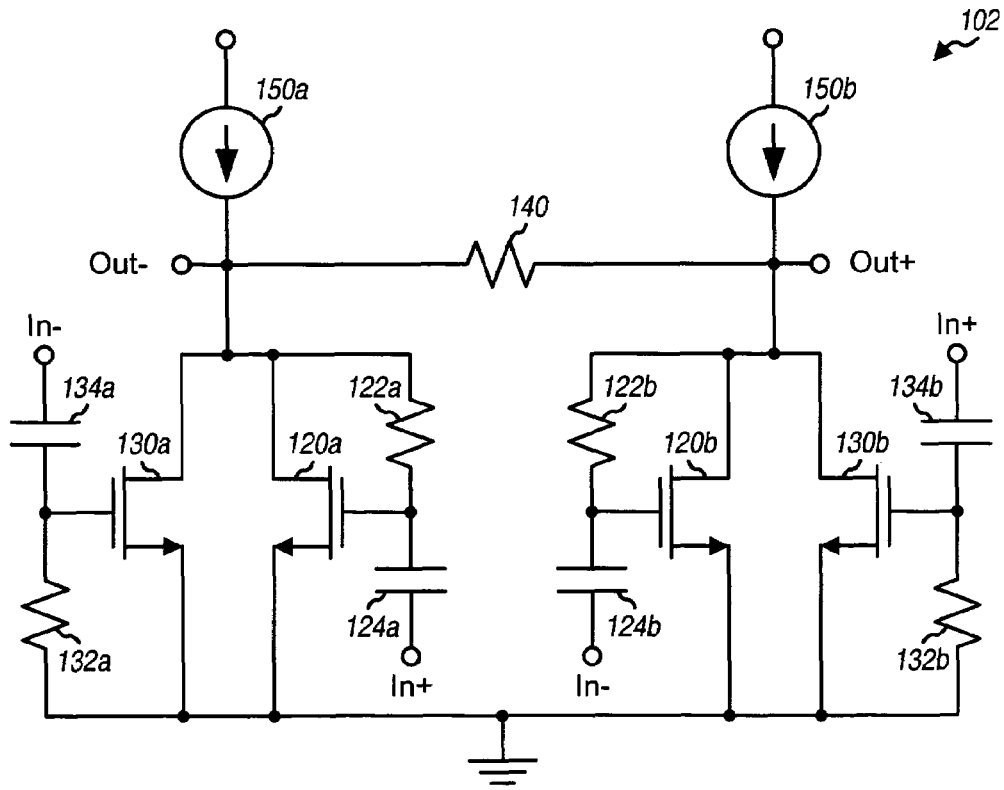
FIG. 2 shows a single-stage amplifier with compensation transistors.

FIG. 2 shows a schematic diagram of a single-stage amplifier 102 in accordance with another embodiment. Amplifier 102 includes all of the circuit elements of amplifier 100 in FIG. 1. In addition, amplifier 102 further includes compensation transistors 130a and 130b, resistors 132a and 132b, and capacitors 134a and 134b. Transistor 130a couples in parallel with transistor 120a and has its source coupled to circuit ground and its drain coupled to the drain of transistor 120a. Resistor 132a has one end coupled to the gate of transistor 130a and the other end coupled to circuit ground. Capacitor 134a has one end coupled to the gate of transistor 130a and the other end receiving the inverting input signal (In−). Similarly, transistor 130b couples in parallel with transistor 120b and has its source coupled to circuit ground and its drain coupled to the drain of transistor 120b. Resistor 132b has one end coupled to the gate of transistor 130b and the other end coupled to circuit ground. Capacitor 134b has one end coupled to the gate of transistor 130b and the other end receiving the non-inverting input signal (In+). Transistors 130a and 130b thus receive the In− and In+ input signals at their gates via AC coupling capacitors 134a and 134b, respectively, and are self-biased to circuit ground by resistors 132a and 132b, respectively.

Transistors 120a and 120b each have parasitic capacitance $C_{gd}$ between the drain and gate of the transistor. This parasitic capacitance $C_{gd}$ causes several deleterious effects. First, the parasitic capacitance $C_{gd}$ reduces the bandwidth of the amplifier. Second, the parasitic capacitance $C_{gd}$ limits the dynamic range of the amplifier. Dynamic range is the ratio of the largest signal level to the smallest signal level achievable by the amplifier. Leakage current flows between the drain and gate of each transistor 120 through the parasitic capacitance $C_{gd}$. When the transconductance $g_m$ is small, the leakage current through the parasitic capacitance $C_{gd}$ is relatively large, which then results in reduced dynamic range. The parasitic capacitance $C_{gd}$ is typically small and normally does not degrade performance unless the leakage current is comparable to the signal current.

Transistors 130a and 130b are compensation transistors used to mitigate the deleterious effects of the parasitic capacitance $C_{gd}$ of transistors 120a and 120b, respectively. Transistors 130a and 130b are dimensioned such that each of these transistors has the same parasitic capacitance $C_{gd}$ between the gate and drain of the transistor. Transistors 130a and 130b are driven by the In− and In+ input signals, respectively, having opposite polarity as the In+ and In− input signals for transistors 120a and 120b, respectively. Thus, the leakage current through transistor 130a is opposite in polarity to the leakage current through transistor 120a. The net leakage current through the drains of both transistors 120a and 130a is approximately zero, and the parasitic capacitance $C_{gd}$ of transistor 120a is effectively compensated by transistor 130a. Transistor 130a has a transconductance $g_m$ of zero because its gate is biased to circuit ground via resistor 132a and thus minimally affects the gain of amplifier 102. Transistor 130b compensates for the parasitic capacitance $C_{gd}$ of transistor 120b in the same manner that transistor 130a compensates for the parasitic capacitance $C_{gd}$ of transistor 120a. Transistors 130a and 130b also allow for high attenuation of the differential input signal (In+ and In−).

Figure 3:
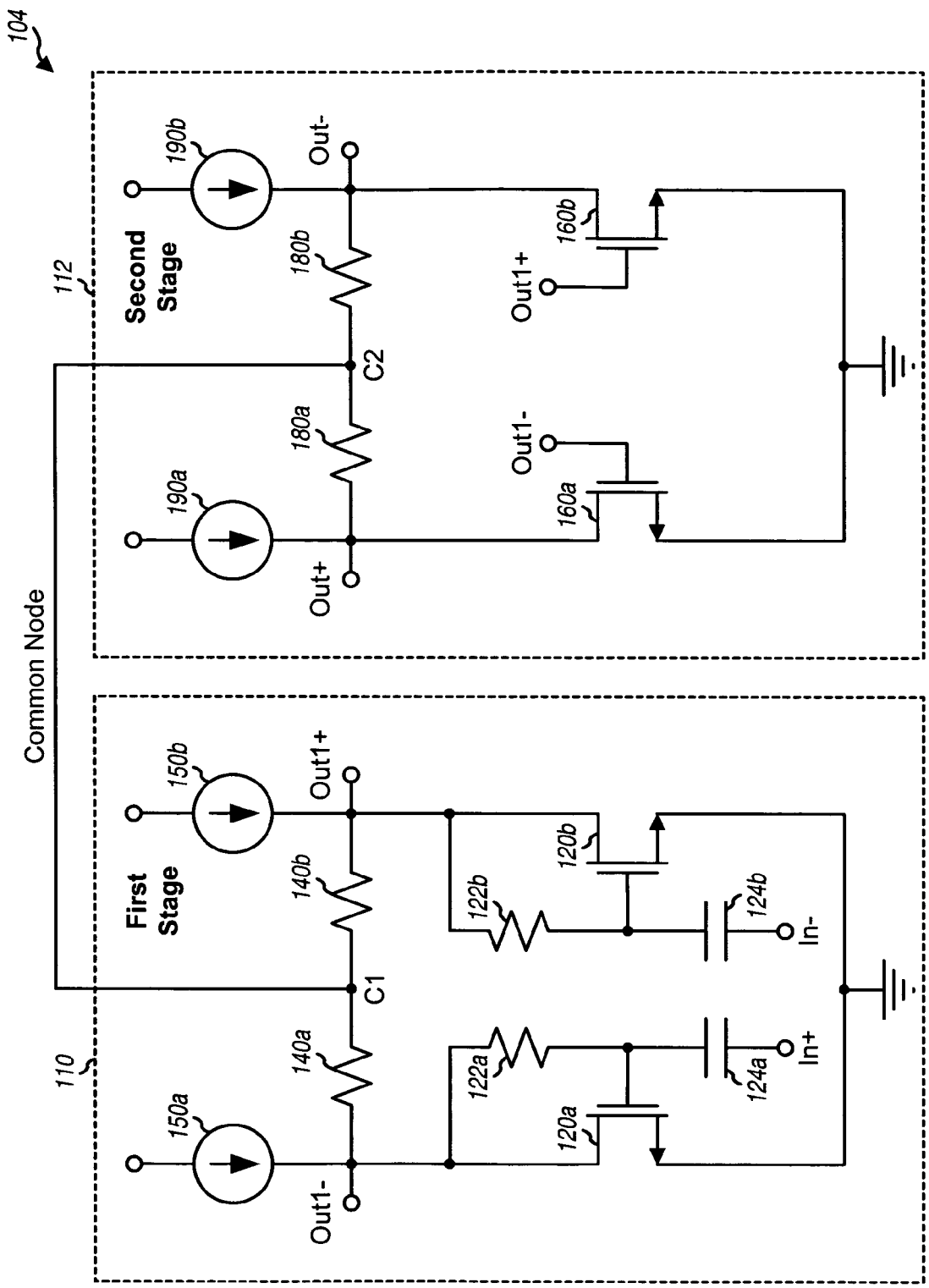
FIG. 3 shows a two-stage amplifier.

FIG. 3 shows a schematic diagram of a two-stage amplifier 104 in accordance with yet another embodiment. Amplifier 104 includes two stages 110 and 112 that are coupled in cascade.

First stage 110 is a self-biased pseudo-differential amplifier composed of transistors 120a and 120b, resistors 122a and 122b, capacitors 124a and 124b, load impedances 140a and 140b, and current sources 150a and 150b. Transistors 120a and 120b, resistors 122a and 122b, capacitors 124a and 124b, and current sources 150a and 150b are coupled in the manner described above for FIG. 1. The gate bias of transistors 120a and 120b is set by current sources 150a and 150b, respectively, via resistors 122a and 122b, respectively. Load impedances 140a and 140b couple in series and to the drains of transistors 120a and 120b. Load impedances 140a and 140b serve as the load of first stage 110 and may be resistors, inductors, capacitors, or a combination thereof. The drains of transistors 120a and 120b provide the differential output signal (Out1− and Out1+) for first stage 110. First stage 110 is similar to single-stage amplifier 100 shown in FIG. 1, except that load impedance 140 in FIG. 1 is replaced with load impedances 140a and 140b in FIG. 3.

Second stage 112 is composed of transistors 160a and 160b, load impedances 180a and 180b, and current sources 190a and 190b, which are coupled in similar manner as transistors 120a and 120b, load impedances 140a and 140b, and current sources 150a and 150b in first stage 110. The gates of transistors 160a and 160b, which are the differential input for second stage 112, are coupled to the drains of transistors 120a and 120b, respectively, which are the differential output for first stage 110. Load impedances 180a and 180b couple in series and to the drains of transistors 160a and 160b. Load impedances 180a and 180b serve as the load of second stage 112 and may also be resistors, inductors, capacitors, or a combination thereof. Load impedances 140a and 140b for first stage 110 and load impedances 180a and 180b for second stage 112 may be selected independently based on the application in which amplifier 104 will be used. For example, load impedances 140a and 140b may be resistive, and load impedances 180a and 180b may be a parallel resonator tank. Current sources 190a and 190b couple to the drains of transistors 160a and 160b, respectively, and provide the bias current for these transistors. The drains of transistors 160a and 160b provide the differential output signal (Out+ and Out−) for second stage 112, which is also the different output signal for amplifier 104.

For the embodiment shown in FIG. 3, the common node C1 of load impedances 140a and 140b for first stage 110 is coupled to the common node C2 of load impedances 180a and 180b for second stage 112. This connection of node C1 to node C2 serves several beneficial purposes. First, the connection properly sets the drain voltage of transistors 160a and 160b in second stage 112. In an ideal case, this drain voltage is equal to the gate bias voltage of transistors 160a and 160b, and transistors 160a and 160b are biased at the same operating point as transistors 120a and 120b. However, mismatch in transistors and current sources will create different drain voltages for transistors 120a and 120b in first stage 110 and transistors 160a and 160b in second stage 112, which in turn results in gain control error. In general, this mismatch produces second order effects. Transistors 160a and 160b in second stage 112 thus obtain biasing from first stage 110, and self-biasing resistors are not needed for transistors 160a and 160b. Second, this connection provides a negative feedback loop between the two amplifier stages. The feedback loop provides rejection of common-mode voltages applied at the differential input (In+ and In−) of first stage 110 and helps suppress common-mode noise including power supply noise that is presented common-mode to amplifier 104.

Figure 4:
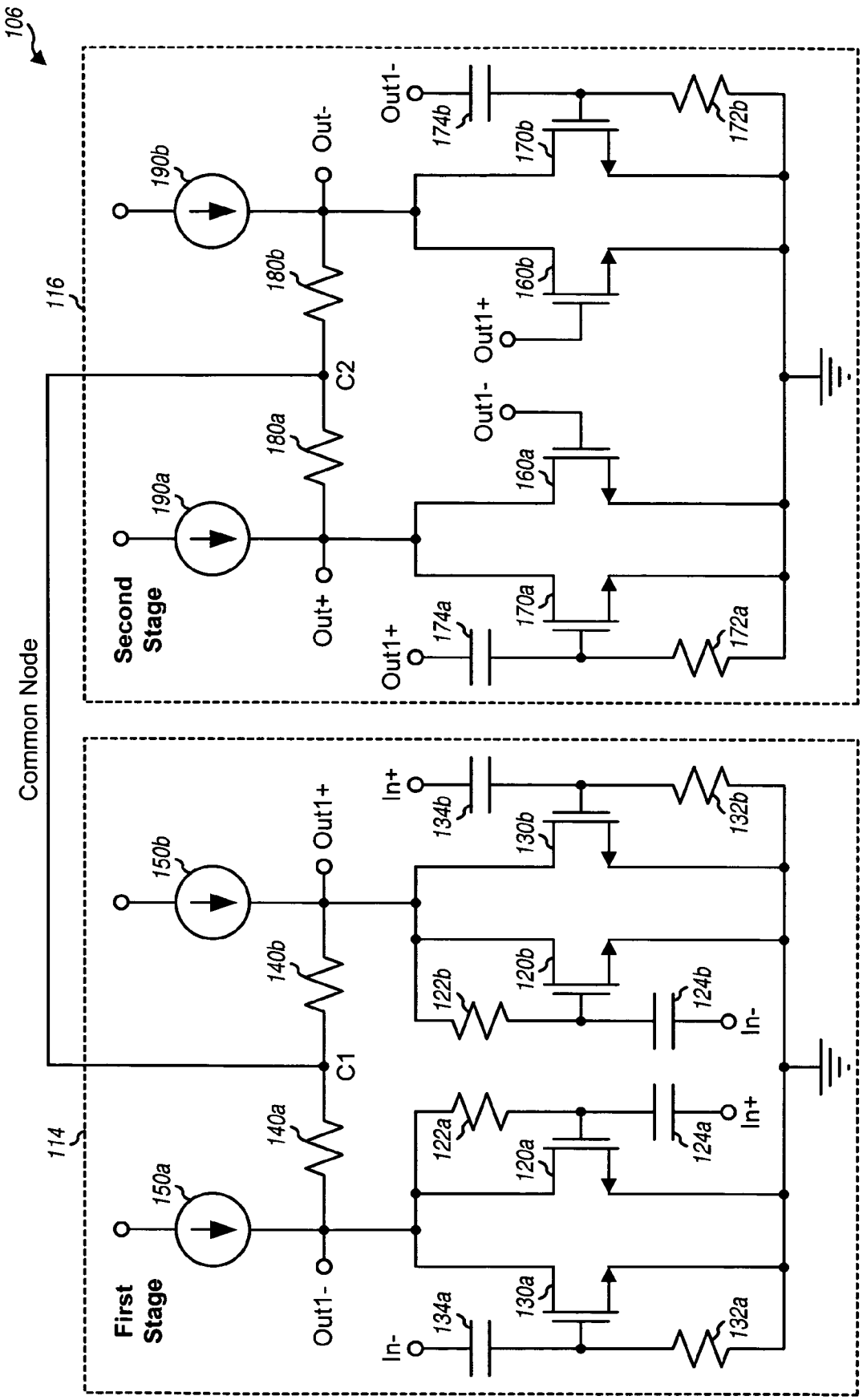
FIG. 4 shows a two-stage amplifier with compensation transistors.

FIG. 4 shows a schematic diagram of a two-stage amplifier 106 in accordance with yet another embodiment. Amplifier 106 includes first stage 114 and second stage 116 that are coupled in cascade. Stages 114 and 116 include all of the circuit elements in stages 110 and 112, respectively, of amplifier 104 in FIG. 3. In addition, first stage 114 of amplifier 106 further includes compensation transistors 130a and 130b, biasing resistors 132a and 132b, and AC coupling capacitors 134a and 134b. Second stage 116 of amplifier 106 further includes compensation transistors 170a and 170b, biasing resistors 172a and 172b, and AC coupling capacitors 174a and 174b.

In first stage 114, compensation transistors 130a and 130b couple in parallel with transistors 120a and 120b, respectively. Resistors 132a and 132b provide biasing for transistors 130a and 130b, respectively. Capacitors 134a and 134b provide AC coupling of the In− and In+ input signals to the gates of transistors 130a and 130b, respectively. Compensation transistors 130a and 130b are cross-excited and receive the complementary input signals as their counterpart gain transistors 120a and 120b, respectively. In second stage 116, compensation transistors 170a and 170b couple in parallel with transistors 160a and 160b, respectively. Resistors 172a and 172b provide biasing for transistors 170a and 170b, respectively. Capacitors 174a and 174b provide AC coupling of the Out1+ Out1− signals from first stage 114 to the gates of transistors 170a and 170b, respectively. Compensation transistors 170a and 170b receive the complementary signals as their counterpart gain transistors 160a and 160b, respectively.

Compensation transistors 130a and 130b can mitigate the leakage current through the gate-drain parasitic capacitance $C_{gd}$ of transistors 120a and 120b, respectively. Similarly, compensation transistors 170a and 170b can mitigate the leakage current through the parasitic capacitance $C_{gd}$ of transistors 160a and 160b, respectively. The gates of compensation transistors 130a, 130b, 170a and 170b are biased to circuit ground via resistors 132a, 132b, 172a and 172b, respectively. Hence, these compensation transistors have transconductance $g_m$ of zero and thus minimally affect the gain of amplifier 106.

Figure 5:
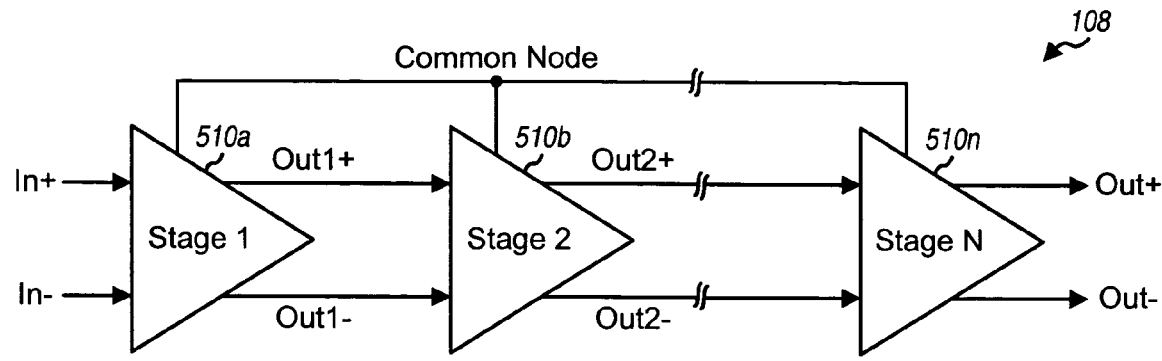
FIG. 5 shows a multi-stage amplifier.

FIG. 5 shows a block diagram of a multi-stage amplifier 108 in accordance with yet another embodiment. Amplifier 108 includes N stages 510a through 510n, where N may be any integer greater than one. First stage 510a may be implemented with first stage 110 in FIG. 3 or first stage 114 in FIG. 4. Each of the subsequent stages 510b through 510n may be implemented with second stage 112 in FIG. 3 or second stage 116 in FIG. 4. First stage 510a receives the differential input signal (In+ and In−) for amplifier 500. The differential output of each stage 510, except for last stage 510n, is coupled to the differential input of the next stage. Last stage 510n provides the differential output signal (Out+ and Out−) for amplifier 500. The common nodes of the load impedances for all N stages 510a through 510n may be coupled together, as shown in FIG. 5, to provide biasing and common-mode feedback, as described above for FIG. 3. Alternatively, the common nodes for the N stages 510 may be coupled via bias circuits, which are not shown in FIG. 5.

In normal operation, the gain of each amplifier stage is the product of the transistor transconductance $g_m$ and the load impedance Z for that stage, as shown in equation (4). For amplifiers 104, 106, and 108 in FIGS. 3, 4, and 5, respectively, having two or more stages, the overall gain of the amplifier is the product of the linear gains (or the sum of the logarithmic gains) of the individual stages.

Each of the amplifiers in FIGS. 1 through 5 may be operated as a fixed gain amplifier or as a variable gain amplifier (VGA). Gain control for a VGA may be achieved by varying the drain current $I_D$, which affects the transconductance $g_m$ as described above, which in turn affects the transistor gain Av. Variable drain current may be provided using various circuit designs.

Figure 6:
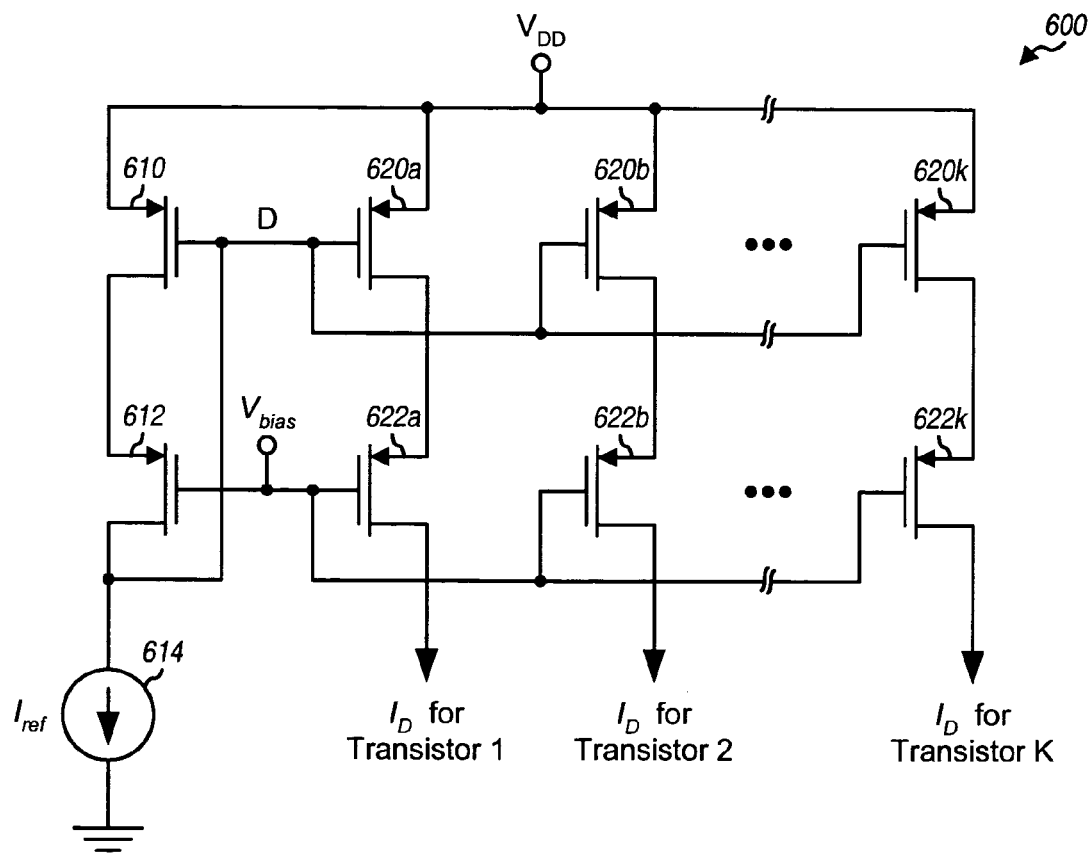
FIG. 6 shows a cascade current mirror used to supply bias currents.

FIG. 6 shows an embodiment of a wide-swing cascade current mirror 600, which may be used to supply variable bias currents for all gain transistors in an amplifier. Current mirror 600 may be used for current sources 150a and 150b in FIGS. 1 and 2 and may provide drain currents for gain transistors 120a and 120b in amplifiers 100 and 102. Current mirror 600 may also be used for current sources 150a, 150b, 190a and 190b in FIGS. 3 and 4 and may provide drain currents for gain transistors 120a, 120b, 160a and 160b in amplifiers 104 and 106.

For the embodiment shown in FIG. 6, current mirror 600 provides bias current for K gain transistors, where K=2 for single-stage amplifiers 100 and 102 in FIGS. 1 and 2, and K=4 for two-stage amplifiers 104 and 106 in FIGS. 3 and 4. Current mirror 600 includes transistors 610 and 612, a current source 614, and K pairs of transistors 620a and 622a through 620k and 622k. For the embodiment shown in FIG. 6, all transistors are implemented with P-channel FETs. Transistors 610 and 612 and current source 614 are coupled in series. Transistor 610 has its source coupled to a power supply $V_{DD}$, its gate coupled to a node D, and its drain coupled to the source of transistor 612. Transistor 612 has its gate receiving a bias voltage $V_{bias}$ and its drain coupled to one end of current source 614. The other end of current source 614 couples to circuit ground. Current source 614 provides a reference current $I_{ref}$ which may be a fixed current or an adjustable current.

The K pairs of transistors 620a and 622a through 620k and 622k are used to provide the drain current $I_D$ for K gain transistors in an amplifier. Each pair of transistors 620i and 622i, where i=1 . . . K, is coupled in series and further in a current mirror configuration with the pair of transistors 610 and 612. Thus, the gates of transistors 620a through 620k couple together and to the gate of transistor 610, and the sources of transistors 620a through 620k couple to the power supply $V_{DD}$. The gates of transistors 622a through 622k also couple together and to the gate of transistor 612. The drains of transistors 620a through 620k couple to the sources of transistors 622a through 622k, respectively. The drain of transistor 622a provides the drain current $I_D$ for a first gain transistor, the drain of transistor 622b provides the drain current $I_D$ for a second gain transistor, and so on, and the drain of transistor 622k provides the drain current $I_D$ for the K-th gain transistor.

Transistors 620a through 620k may be dimensioned with the same size and may further be scaled according to the sizes of the K gain transistors receiving the drain currents via transistors 620a through 620k. Transistors 622a through 622k may also be dimensioned with the same size and may further be scaled according to the sizes of the K gain transistors. The sizes of transistors 620i and 622i for each pair may be scaled relative to the sizes of transistors 610 and 612 to achieve the desired amount of drain current for the i-th gain transistor.

For a given bias voltage $V_{bias}$ applied at the gate of transistor 612 and the gates of transistors 622a through 622k, the amount of current flowing through each transistor pair 620i and 622i (which is the drain current $I_D$ for the i-th gain transistor) is dependent on (1) the reference current $I_{ref}$ provided by current source 614 and (2) the ratio of the sizes of transistors 620i and 622i to the sizes of transistors 610 and 612. The drain current $I_D$ may be adjusted by changing the reference current $I_{ref}$. The bias voltage $V_{bias}$ provides proper gate bias for transistor 612 and transistors 622a through 622k to keep these transistors away from a triode region. The bias voltage $V_{bias}$ may be generated by a bias circuit that is not shown in FIG. 6.

The gain transistors for all stages of an amplifier may be identically biased with the same drain current $I_D$. This may be achieved by dimensioning all K transistors 620a through 620k with the same size and dimensioning all K transistors 622a through 622k with the same size. Alternatively, the gain transistors for each stage of an amplifier may be biased with a different drain current selected for that stage. For example, the drain current for the gain transistors in each stage may be determined based on the load for that stage, e.g., more drain current for larger load. Different drain currents for different stages may be obtained by dimensioning transistors 620 and 622 used for each stage with the appropriate sizes.

FIG. 6 shows a specific design for the current sources for the amplifiers in FIGS. 1 through 5. Fixed or variable drain currents for the gain transistors may also be provided with other current source designs known in the art.

Figure 7:
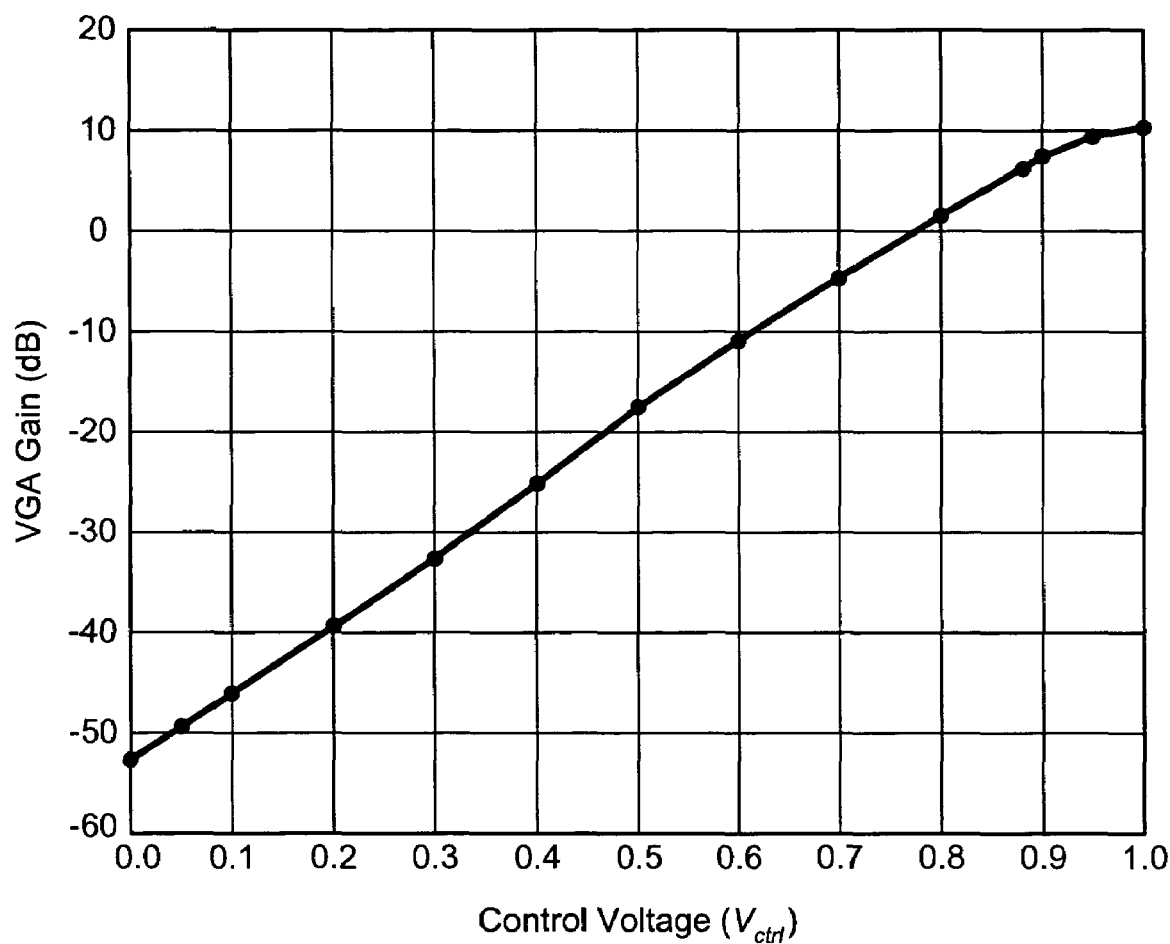
FIG. 7 shows a plot of variable gain for a two-stage amplifier.

FIG. 7 shows a plot of the variable gain achievable by two-stage amplifier 106 in FIG. 4. FIG. 7 is for an exemplary CMOS VGA design at 850 MHz. In FIG. 7, the vertical axis shows the overall gain (in decibels or dB) for the two-stage amplifier, and the horizontal axis shows a control voltage $V_{ctrl}$ (in volts) used to adjust the reference current $I_{ref}$ of current source 614 in current mirror 600. As indicated in FIG. 7, a wide gain range of over 60 decibels (dB) may be achieved by amplifier 106 even with the simple circuit design.

The amplifier embodiments described herein have the following advantages:

1. Very simple structure and straightforward transistor biasing scheme. The transistor size and bias current are such that all of the gain transistors are biased at approximately the same gate voltage, and $V_{gd}$ is zero. This enables accurate gain control of the gain transistors.
2. DC coupling between stages eliminates coupling loss and saves die area for AC coupling capacitors.
3. All nodes in the amplifier are low impedance. The amplifier is thus inherently wideband and suitable for RF applications.
4. Compensation transistors can mitigate the current leakage through the gate-drain parasitic capacitance $C_{gd}$ of the gain transistors. The amplifier may thus be used as a high attenuation amplifier.
5. Large range of gain control is readily achievable, e.g., over 60 dB for an exemplary design of two-stage amplifier 106 in FIG. 4. The gain range is determined by the dynamic range of the drain current.

The amplifier described herein may be used for various wideband and/or high frequency applications such as communication, networking, computing, consumer electronics, and so on. The amplifier may be used in wireless communication systems such as a CDMA system, a Time Division Multiple Access (TDMA) system, a Global System for Mobile Communications (GSM) system, an Advanced Mobile Phone System (AMPS) system, Global Positioning System (GPS), a multiple-input multiple-output (MIMO) system, an orthogonal frequency division multiplexing (OFDM) system, an orthogonal frequency division multiple access (OFDMA) system, a wireless local area network (WLAN), and so on. The use of the amplifier for wireless communication is described below.

Figure 8:
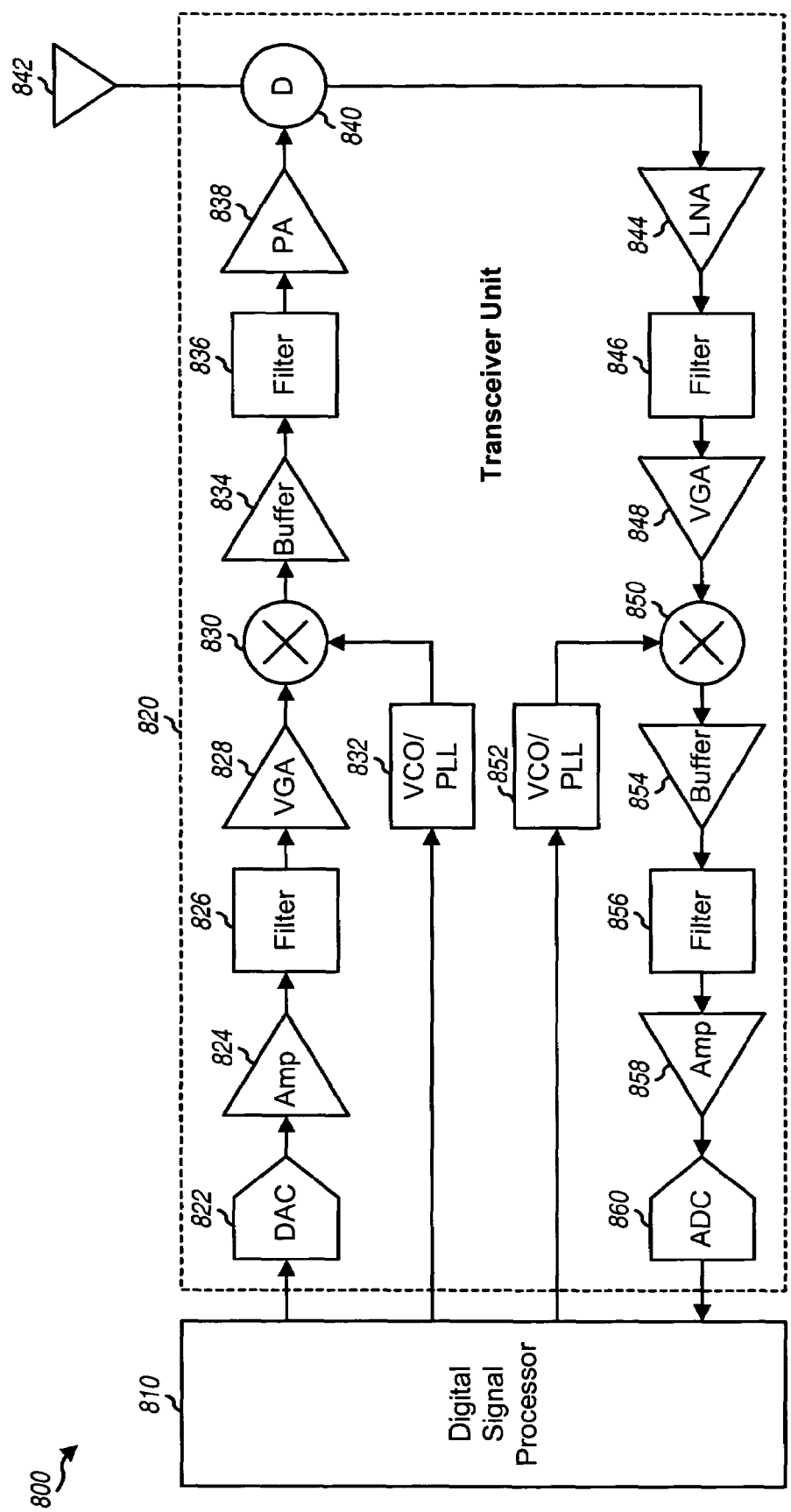
FIG. 8 shows a block diagram of a wireless device.

FIG. 8 shows a block diagram of a wireless device 800 that may be used for wireless communication. Wireless device 800 may be a cellular phone, a user terminal, a handset, a personal digital assistant (PDA), or some other device or design. Wireless device 800 is capable of providing bi-directional communication via a transmit path and a receive path.

On the transmit path, a digital signal processor (DSP) 810 processes traffic data and provides a stream of chips to a transceiver unit 820. Within transceiver unit 820, one or more digital-to-analog converters (DACs) 822 convert the stream of chips to one or more analog signals. The analog signal(s) are amplified by an amplifier (Amp) 824, filtered by a filter 826, amplified with a variable gain by a VGA 828, and frequency upconverted from baseband to RF by a mixer 830 to generate an RF signal. The frequency upconversion is performed with a local oscillator (LO) signal from a voltage controlled oscillator (VCO)/phase locked loop (PLL) 832. The RF signal is buffered by a buffer 834, filtered by a filter 836, amplified by a power amplifier (PA) 838, routed through a duplexer (D) 840, and transmitted from an antenna 842.

On the receive path, a signal is received by antenna 842, routed through duplexer 840, amplified by a low noise amplifier (LNA) 844, filtered by a filter 846, amplified with a variable gain by a VGA 848, and frequency downconverted from RF to baseband by a mixer 850 with an LO signal from a VCO/PLL 852. The downconverted signal is buffered by a buffer 854, filtered by a filter 856, amplified by an amplifier 858, and digitized by one or more analog-to-digital converters (ADCs) 860 to generate one or more streams of samples. The sample stream(s) are provided to digital signal processor 810 for processing.

FIG. 8 shows a specific transceiver design using a direct-conversion architecture. In a typical transceiver, the signal conditioning for each signal path may be performed by one or more stages of amplifier, filter, mixer, and so on, as is known in the art. FIG. 8 shows some of the circuit blocks that may be used for signal conditioning. The amplifier described herein may be used for the various amplifiers and buffers in the transmit and receive paths.

The amplifier described herein may be used for various frequency ranges including baseband, intermediate frequency (IF), RF, and so on. For example, the amplifier may be used for various frequency bands commonly used for wireless communication, such as:

Cellular band from 824 to 894 MHz,

Personal Communication System (PCS) band from 1850 to 1990 MHz,

Digital Cellular System (DCS) band from 1710 to 1880 MHz,

GSM900 band from 890 to 960 MHz,

International Mobile Telecommunications-2000 (IMT-2000) band from 1920 to 2170 MHz, and Global Positioning System (GPS) band from 1574.4 to 1576.4 MHz.

The amplifier described herein may be fabricated in various integrated circuit (IC) processes such as complementary metal oxide semiconductor (CMOS), bipolar, bipolar-CMOS (Bi-CMOS), gallium arsenide (GaAs), and so on. The amplifier may also be fabricated on various types of IC such as radio frequency ICs (RFICs).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An integrated circuit comprising:

first and second transistors coupled in a common source configuration with a common source connection directly connected circuit ground and operative to receive non-inverting and inverting input signals, respectively, of a differential input signal and operative to provide an amplified differential output signal across a drain of the first transistor and a drain of the second transistor;

a first resistor coupled between the drain and a gate of the first transistor and operative to provide biasing for the first transistor;

a second resistor coupled between the drain and a gate of the second transistor and operative to provide biasing for the second transistor;
first and second current sources coupled to the drains of the first and second transistors, respectively, and operative to provide bias current for the first and second transistors, respectively; and
a load impedance coupled between the drains of the first and second transistors.

2. The integrated circuit of claim 1, wherein the first and second current sources are operable to provide variable amounts of bias current for the first and second transistors, respectively.

3. The integrated circuit of claim 1, wherein the first and second current sources are operable to provide a fixed amount of bias current for the first and second transistors, respectively.

4. The integrated circuit of claim 1, wherein the first and second transistors are field effect transistors (FETs).

5. The integrated circuit of claim 1, wherein the first and second transistors are metal-oxide semiconductor (MOS) transistors.

6. The integrated circuit of claim 1, wherein the first and second transistors are bipolar junction transistors (BJTs), each BJT having a base, an emitter, and a collector corresponding to the gate, the source, and the drain, respectively, of the first or second transistor.

7. The integrated circuit of claim 1, wherein the load impedance is a resistor.

8. An integrated circuit comprising:
first and second transistors coupled in a common source configuration with a common source connection directly connected circuit ground;
a first resistor coupled between a drain and a gate of the first transistor and operative to provide biasing for the first transistor;
a second resistor coupled between a drain and a gate of the second transistor and operative to provide biasing for the second transistor;
first and second current sources coupled to the drains of the first and second transistors, respectively, and operative to provide bias current for the first and second transistors, respectively; and
a load impedance coupled between the drains of the first and second transistors, wherein the load impedance is a complex load comprised of resistive and reactive elements.

9. An integrated circuit comprising:
first and second transistors coupled in a common source configuration and operative to receive non-inverting and inverting input signals, respectively, of a differential input signal;
third and fourth transistors coupled in parallel with the first and second transistors, respectively, and operative to receive the inverting and non-inverting input signals, respectively;
a first resistor coupled between a drain and a gate of the first transistor and operative to provide biasing for the first transistor;
a second resistor coupled between a drain and a gate of the second transistor and operative to provide biasing for the second transistor;
first and second current sources coupled to the drains of the first and second transistors, respectively, and operative to provide bias current for the first and second transistors, respectively;

a third resistor coupled to a gate of the third transistor and circuit ground;
a fourth resistor coupled to a gate of the fourth transistor and circuit ground; and
a load impedance coupled between the drains of the first and second transistors.

10. A device comprising:
first and second transistors coupled in a common source configuration with a common source connection directly connected circuit ground and operative to receive non-inverting and inverting input signals, respectively, of a differential input signal;
a first resistor coupled between a drain and a gate of the first transistor and operative to provide biasing for the first transistor;
a second resistor coupled between a drain and a gate of the second transistor and operative to provide biasing for the second transistor;
first and second current sources coupled to the drains of the first and second transistors, respectively, and operative to provide bias current for the first and second transistors, respectively; and
a load impedance coupled to the drains of the first and second transistors.

11. The device of claim 10, further comprising:
third and fourth transistors coupled in parallel with the first and second transistors, respectively, and operative to receive the inverting and non-inverting input signals, respectively.

12. An integrated circuit comprising:
first and second transistors coupled in a common source configuration with a common source connection directly connected circuit ground and operative to receive non-inverting and inverting input signals, respectively, of a differential input signal;
third and fourth transistors coupled in parallel with the first and second transistors, respectively, and operative to receive the inverting and non-inverting input signals, respectively, of the differential input signal;
a first pull down resistor coupling an input of the third transistor to circuit ground;
a second pull down resistor coupling an input of the fourth transistor to circuit ground;
first and second current sources coupled to drains of the first and second transistors, respectively, and operative to provide bias current for the first and second transistors, respectively; and
a load impedance coupled to the drains of the first and second transistors.

13. An integrated circuit comprising:
at least two amplifier stages coupled in cascade, each amplifier stage comprising
first and second transistors coupled in a common source configuration with a common source connection directly connected circuit ground and operative to receive a differential input signal for the amplifier stage and provide a differential output signal for the amplifier stage,
first and second current sources coupled to the first and second transistors, respectively, and operative to provide bias current for the first and second transistors, respectively, and
first and second load impedances coupled to the first and second transistors, respectively, and further to a common node for the amplifier stage, the common node not coupled to a supply voltage or circuit ground.

14. The integrated circuit of claim 13, wherein a first amplifier stage among the at least two amplifier stages further comprises
   a first resistor coupled between a drain and a gate of the first transistor and operative to provide biasing for the first transistor, and
   a second resistor coupled between a drain and a gate of the second transistor and operative to provide biasing for the second transistor.

15. The integrated circuit of claim 13, wherein the first and second current sources for each amplifier stage are operable to provide variable amounts of bias current for the first and second transistors, respectively.

16. The integrated circuit of claim 13, wherein the first and second current sources for the at least two amplifier stages are operable to provide variable amounts of bias current to achieve a gain range of at least 60 decibels for the at least two amplifier stages.

17. The integrated circuit of claim 13, wherein the first and second transistors for the at least two amplifier stages are field effect transistors (FETs).

18. The integrated circuit of claim 13, wherein the differential input signal for a first amplifier stage is AC coupled to the first and second transistors in the first amplifier stage.

19. The integrated circuit of claim 13, wherein the differential output signal for each amplifier stage, except for a last amplifier stage, is DC coupled to the first and second transistors in a subsequent amplifier stage.

20. An integrated circuit comprising:
   at least two amplifier stages coupled in cascade, each amplifier stage comprising:
   first and second transistors coupled in a common source configuration and operative to receive a differential input signal for the amplifier stage and provide a differential output signal for the amplifier stage,
   first and second current sources coupled to the first and second transistors, respectively, and operative to provide bias current for the first and second transistors, respectively, and
   first and second load impedances coupled to the first and second transistors, respectively, and further to a common node for the amplifier stage, the common node not coupled to a supply voltage or circuit ground, and
   wherein common nodes for the at least two amplifier stages are coupled together.

21. An integrated circuit comprising:
   at least two amplifier stages coupled in cascade, each amplifier stage comprising:
   first and second transistors coupled in a common source configuration and operative to receive a differential input signal for the amplifier stage and provide a differential output signal for the amplifier stage,
   third and fourth transistors coupled in parallel with the first and second transistors, respectively, wherein the first and third transistors are operative to receive non-inverting and inverting input signals, respectively, of the differential input signal for the amplifier stage, and wherein the second and fourth transistors are operative to receive the inverting and non-inverting input signals, respectively,
   a first pull down resistor coupling an input of the third transistor to circuit ground,
   a second pull down resistor coupling an input of the fourth transistor to circuit ground,
   first and second current sources coupled to the first and second transistors, respectively, and operative to provide bias current for the first and second transistors, respectively, and
   first and second load impedances coupled to the first and second transistors, respectively, and further to a common node for the amplifier stage.

22. An integrated circuit comprising:
   at least two amplifier stages coupled in cascade, each amplifier stage comprising:
   first and second transistors coupled in a common source configuration and operative to receive a differential input signal for the amplifier stage and provide a differential output signal for the amplifier stage,
   first and second current sources coupled to the first and second transistors, respectively, and operative to provide bias current for the first and second transistors, respectively, and
   first and second load impedances coupled to the first and second transistors, respectively, and further to a common node for the amplifier stage, and
   wherein the first and second current sources for the at least two amplifier stages are implemented with a cascade current mirror.

23. The integrated circuit of claim 22, wherein the cascade current mirror comprises
   a first pair of transistors coupled in series,
   a reference current source coupled in series with the first pair of transistors, and
   one pair of transistors for each of the first and second current sources for the at least two amplifier stages, wherein the transistors in the one pair are coupled in series and a gate of each transistor in the one pair couples to a gate of a corresponding transistor in the first pair.

24. A device comprising:
   at least two amplifier stages coupled in cascade, each amplifier stage comprising
   first and second transistors coupled in a common source configuration with a common source connection directly connected circuit ground and operative to receive a differential input signal for the amplifier stage and provide a differential output signal for the amplifier stage,
   first and second current sources coupled to the first and second transistors, respectively, and operative to provide bias current for the first and second transistors, respectively, and
   first and second load impedances coupled to the first and second transistors, respectively, and further to a common node for the amplifier stage, the common node not coupled to a supply voltage or circuit ground,
   wherein common nodes for the at least two amplifier stages are coupled together.

25. The device of claim 24, wherein each amplifier stage further comprises
   third and fourth transistors coupled in parallel with the first and second transistors, respectively, wherein the first and third transistors are operative to receive non-inverting and inverting input signals, respectively, of the differential input signal for the amplifier stage, and wherein the second and fourth transistors are operative to receive the inverting and non-inverting input signals, respectively.

* * * * *